United States Patent [19]

Lang et al.

[11] Patent Number: 4,618,782

[45] Date of Patent: Oct. 21, 1986

[54] TRANSISTOR POWER AMPLIFIER HAVING REDUCED SWITCHING TIMES

[75] Inventors: Albrecht Lang, Leinfelden-Echterdingen; Walter H. Sakmann, Nufringen, both of Fed. Rep. of Germany

[73] Assignee: International Business Machines Corporation, Armonk, N.Y.

[21] Appl. No.: 520,410

[22] Filed: Aug. 5, 1983

[30] Foreign Application Priority Data

Aug. 25, 1982 [EP] European Pat. Off. ........ 82107773.2

[51] Int. Cl.$^4$ ...................... H03K 17/60; H03K 3/01; H03K 3/33
[52] U.S. Cl. .................................. 307/255; 307/270; 307/490; 307/300
[58] Field of Search ............... 307/490, 491, 500, 475, 307/300, 268, 270, 255, 456, 454, 242, 243, 549; 330/118, 255

[56] References Cited

U.S. PATENT DOCUMENTS

| | | | |
|---|---|---|---|
| 3,174,054 | 3/1965 | Wortzman | 307/490 |
| 3,244,910 | 4/1966 | Leifer | 307/284 |
| 3,535,557 | 10/1970 | Rogers et al. | 307/268 |
| 3,786,485 | 1/1974 | Wojcik | 340/324 M |
| 3,825,773 | 7/1974 | Kivistik | 307/255 |
| 4,028,633 | 6/1977 | Rogers et al. | 330/118 |
| 4,042,842 | 8/1977 | Hegendörfer | 307/255 |
| 4,239,989 | 12/1980 | Brajder | 307/255 |
| 4,266,149 | 5/1981 | Yoshida | 307/255 |
| 4,410,809 | 10/1983 | Furuichi et al. | 307/255 |

FOREIGN PATENT DOCUMENTS 0104271 8/1979 Japan .................... 307/255
1253670 11/1971 United Kingdom .

OTHER PUBLICATIONS

Tenny, "Voltage Translator Switches Auxiliary Voltages When Needed," Electronics, vol. 55, No. 17, 8/25/82, p. 120.

JP-A-55-166314 (Sony K.K.), Patents Abstracts of Japan, vol. 5, No. 44 (E-50) (716), Mar. 24, 1981.

Primary Examiner—Stanley D. Miller
Assistant Examiner—Timothy P. Callahan
Attorney, Agent, or Firm—T. Rao Coca

[57] ABSTRACT

A pulse-operated transistor power amplifier having reduced switching times. The interconnected base electrodes of a pair of complementary transistors (T3, T4) are connected to the collector of a prestage transistor (T1). By a resistor (R2), the base electrodes are also connected to one terminal (+V) of the operating voltage source, to which the collector of one (T4) of the two complementary transistors is also connected. The collector of the other transistor (T3) is connected to the other terminal of the operating voltage source, which is linked with the reference potential. The emitters of the complementary transistors are also connected to each other and, by a capacitor (C1), to the base of the final stage. The voltage changes occurring at the collector when the prestage is switched are transferred by one of the two complementary transistors and the capacitor (C1) to the base of the final stage transistor (T5). The switching times of this stage are reduced by base charges which are additionally supplied or withdrawn. In a further embodiment a transistor power amplifier having two series-connected complementary final stages (T5, T6) simultaneous conduction of both final stage transistors is prevented by means of a capacitor (C3), one electrode of which is connected to the interconnected emitters of the additional complementary emitter follower for the final stage (T6) switching the reference potential, and the other electrode of which (C3) is connected by a diode (D4) to the base of the complementary final stage (T5). The two inputs (R, U) of the power amplifier are also provided with protection transistors (T10, T11) which when one input transistor (T1) becomes conductive prevent the second input transistor (T2) from becoming conductive as a result of an erroneous input signal.

5 Claims, 5 Drawing Figures

TRANSISTOR POWER AMPLIFIER HAVING REDUCED SWITCHING TIMES

BACKGROUND OF THE INVENTION

The invention relates to a transistor power amplifier having reduced switching times which is suitable for pulse operation. Amplifiers of this type are extremely useful since, compared to continuously operated transistors, they have less power dissipation and therefore a high degree of efficiency. In addition, when used in digitally controlled electrical drives, they permit predetermined rotational speeds being very accurately observed. They are used, for example, when brushless DC motors are employed as drives for magnetic disk storages or for form and type band transport in line printers which are used as output units of data processing systems.

In pulse-operated brushless DC motors if currents of more than 1 A are required to be switched at frequencies ranging from 20 to 200 kHz, short switching times are necessary for the final stage transistors of the power amplifier, in order to avoid overheating these transistors and the electrical breakdown resulting therefrom. As is known, the power dissipation occurring in these transistors depends on the magnitude of the switched current, the operating voltage, and the switching frequency. Short switching times of the final stage transistors thus permit higher switching frequencies without the aforementioned breakdown occurring.

Circuits for reducing the switching times of final stage transistors used in power amplifiers are known in the prior art. However, these circuits invariably require special additional auxiliary voltages.

The present invention, which is specifically set forth in the appended claims, overcomes these and other disadvantages of the prior art. Accordingly, an object of this invention is to provide a transistor power amplifier having reduced switching times which is suitable for pulse operation without requiring special additional auxiliary voltages.

SUMMARY OF THE INVENTION

In accordance with the invention the interconnected base electrodes of a pair of complementary transistors are connected to the collector of the power amplifier input stage transistor. This common point of the three transistors is linked via a resistor to one terminal of the operating voltage source to which is also connected the collector of the first complementary transistor. The collector of the second complementary transistor is connected to the other terminal of the voltage source which terminal functions as a reference potential. The emitters of the complementary transistors are connected (in a push-pull B-mode complementary emitter-follower configuration) to each other and via a capacitor to the base of the output stage transistor. When the input stage is activated, voltage changes occurring at the collector of the first complementary transistor are transferred by one of the complementary transistors to the base of the output stage transistor. The switching times of the output stage are reduced by charges which are additionally supplied to the base of the output stage transistor.

A particular advantage of this invention is that when it is used in conjunction with two series-connected complementary output stage transistors, it prevents simultaneous conduction of the output stage transistors, thereby avoiding the aforementioned electrical breakdown problems. The simultaneous conduction of the final stage transistors is prevented by means of a capacitor which is connected between the emitters of the second pair of complementary input stage transistors and (via a diode) the base of the first complementary output stage transistor.

BRIEF DESCRIPTION OF THE DRAWINGS

The foregoing and other objects, features and advantages of the invention will be described in detail with reference to the accompanying drawings in which.

DETAILED DESCRIPTION OF PREFERRED EMBODIMENTS

Figure 1:
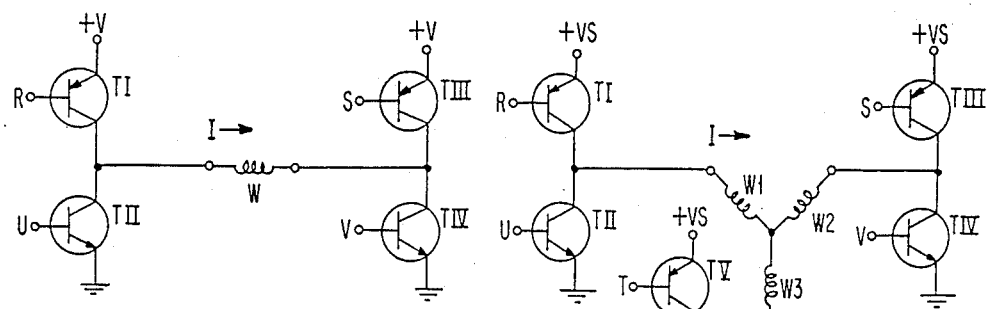
FIG. 1 shows the basic arrangement of the two power amplifiers necessary for the electronic commutation of a brushless DC motor with the energizing winding W and each of which is represented by two series-connected complementary output transistors TI, TII and TIII, TIV, respectively.

The typical operation of an electronic commutation brushless DC motor will now be described briefly with reference to FIG. 1. Assume the energizing winding W of the motor is traversed by a current I flowing from left to right. In this situation transistor TI of the left power amplifier and transistor TIV of the right power amplifier are conductive, while transistors TII and TIII are non-conductive. This leads to a closed circuit in which current I flows from the positive terminal +V of the operating voltage source through transistor TI, energizing winding W of the motor, and transistor TIV to the negative terminal of the operating voltage source connected to ground. As long as current I traverses the energizing winding W from left to right transistor TIV remains conductive. To reduce power dissipation and/or for the digital control of, for example, the rotational speed of the motor, transistor TI is pulse-operated. If the direction of the current flowing through energizing winding W is reversed, transistors TI and TIV are made non-conductive and transistors TIII and TII, of which transistor TIII is pulse-operated, are made conductive.

Figure 2:
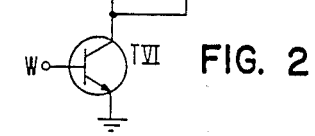
FIG. 2 shows the basic arrangement of the power amplifiers which are required for the electronic commutation of a three-phase brushless DC motor with the star-connected energizing windings W1, W2 and W3.

FIG. 2 shows the arrangement of three power amplifiers for operating a brushless DC motor provided with three energizing windings W1, W2 an W3 which are connected in a star configuration. If current I is to traverse the two windings W1 and W2 from left to right, transistor TI of the first power amplifier and transistor TIV of the second power amplifier are made conductive. In this case, transistor TI is pulse-operated. For reversing the flow of current I through energizing winding W1 and W2, transistor TIII of the second power amplifier and transistor TII of the first power amplifier are made conductive. In this case, transistor TIII is pulse-operated. If the current is to flow through energizing winding W2 and W3 or W1 and W3, the appropriate transistors of the power amplifiers are made conductive according to the direction of current flow required.

Figure 3:
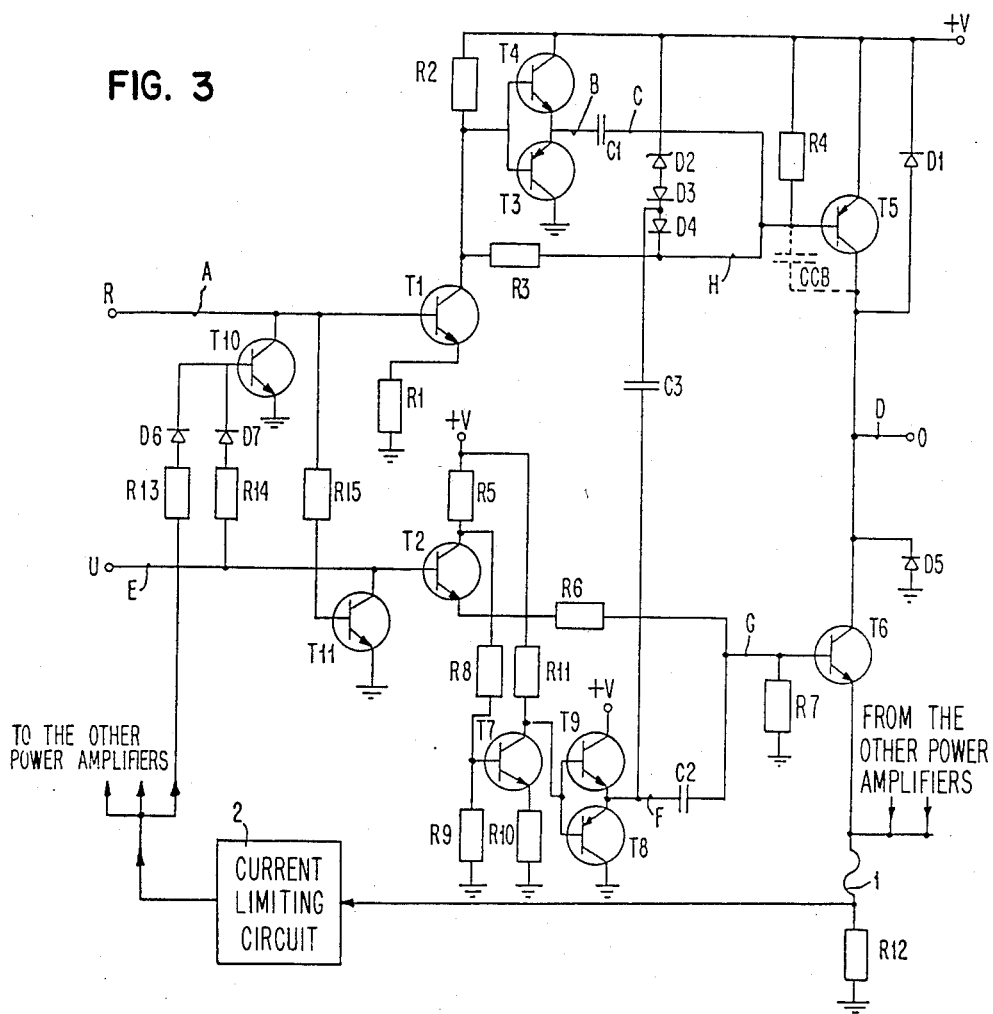
FIG. 3 shows a detailed circuit diagram of a first embodiment of the power amplifier according to the invention.

Referring to FIG. 3 which is a detailed circuit diagram of a first embodiment of the power amplifier in accordance with this invention, the two inputs of the power amplifier comprising two complementary final stage (or output) transistors T5 and T6 (which are, typically, PNP and NPN transistors, respectively) are designated as R and U. Input R leads to the base of the first input transistor T1 (typically, an NPN transistor) and input U to the base of the second input transistor T2 (typically, an NPN transistor). The emitter of T1 is connected to ground through resistor R1, its collector being connected, through resistor R2, to the positive terminal +V of the operating voltage source and, through resistor R3, to the base of PNP output transistor T5. The interconnected base electrodes of two complementary transistors T3 and T4 (which are, typically, PNP and NPN transistors, respectively) are also connected to the collector of T1. These two transistors constitute a push-pull B-mode complementary emitter follower. The emitters of transistors T3 and T4, which are also interconnected, are linked, through a capacitor C1 with the base of transistor T5, which, through resistor R4, is connected to the positive terminal +V of the operating voltage source, to which the emitter of transistor T5 is also connected. The collector of transistor T5 is linked with the output O of the power amplifier. The collector of NPN transistor T4 is connected to the positive terminal +V of the operating voltage source, whereas the collector of PNP transistor T3 is connected to the grounded negative terminal of the operating voltage source. The collector-emitter path of transistor T5 is bridged by a clamping diode D1, whose cathode is connected to the positive terminal +V of the operating voltage source. The cathode of a zener diode D2, which through two series-connected diodes D3 and D4 is linked with the base of transistor T5, is also connected to the positive terminal of the operating voltage source.

The collector of transistor T2, whose base is connected to the second input U of the power amplifier, is linked through resistor R5 with the positive terminal +V of the operating voltage source. Its emitter is connected through resistor R6 to the base of the NPN output transistor T6, which is connected to ground via resistor R7. The collector of transistor T6 is linked with the cathode of a clamping diode D5, whose anode is always maintained at ground potential. The collector of transistor T2 is also linkd with two series-connected resistors R8 and R9, the base of R9 being connected to ground. The junction of the two resistors R8 and R9 is connected to the base of a transistor T7 serving as an inverter and whose emitter is connected to ground through resistor R10 and whose collector is connected to the positive terminal +V of the operating voltage source through resistor R11. The collector of transistor T7 is linked with the interconnected base electrodes of two complementary transistors T8 and T9 (which are, typically, PNP and NPN transistors, respectively). Their emitters, which are also interconnected, are linked through capacitor C2 with the base of the NPN final stage transistor T6. The collector of this transistor is connected to the output O of the power amplifier, whereas its emitter is connected to ground through a fuse 1 and a sense resistor R12. The collector of the NPN transistor T9 is connected to the positive terminal +V of the operating voltage source and that of the PNP transistor T8 to ground potential. The interconnected emitters of transistors T8 and T9 are connected via capacitor C3 to the junction of the two diodes D3 and D4. Through fuse 1, the emitter of transistor T6 is also connected to the input of a current limiting circuit 2 which in the case of a three-phase brushless DC motor is shared by its three power amplifiers and which is shown only as a block in FIG. 3. The output signal of current limiting circuit 2 is applied via a resistor R13 and diode D6 to the base of an overload protection transistor T10 which is of the same conductivity type as the first input transistor T1 and whose collector is connected to the base of this transistor, whereas its emitter is connected to ground. Through a resistor R14 and a diode D7, the second input U of the power amplifier is connected to the base of transistor T10. Through resistor R15, the input R of the power amplifier is also connected to the base of a second overload protection transistor T11 which is of the same conductivity type as the second input transistor T2 and whose collector is connected to the base of T2 and whose emitter is maintained at ground potential.

Figure 5:
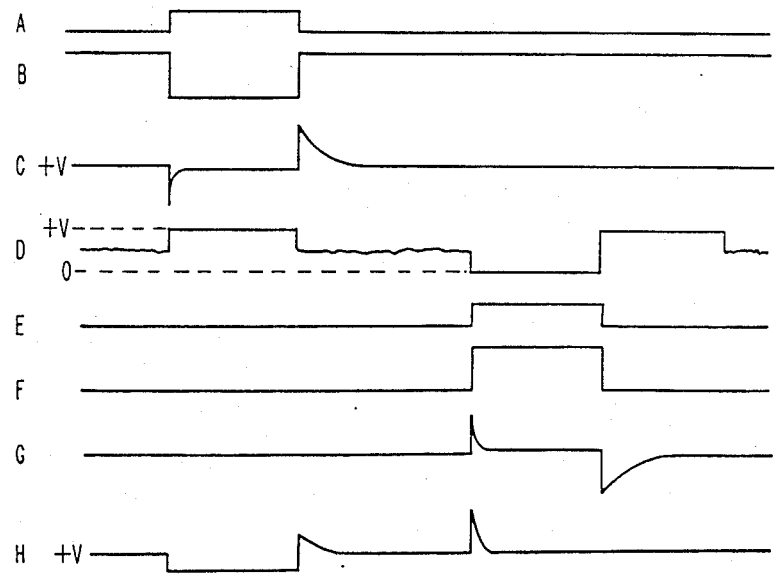
FIG. 5 shows the voltage curves at different points of the power amplifier according to the invention.

To explain the operation of the power amplifier illustrated in FIG. 3 reference is made to the puse diagrams of FIG. 5. Assume that the power amplifier has been inactive. In this state the two final stage transistors T5 and T6 and thus input transistors T1 and T2 are nonconductive. Also, the potential at the collector of transistor T1 equals the voltage +V of the operating voltage source. As a result, the potential of the interconnected base electrodes of the two complementary transistor T3 and T4 also has the value +V. At a positive base potential, NPN transistor T4 is conductive, so that the potential of the interconnected emitters of T3 and T4 also has a value of about +V (curve B in FIG. 5). Assume now that current is to flow from left to right through the motor winding W shown in FIG. 1. To accomplish this, final stage transistor T5, corresponding to transistor T1 in FIG. 1, whould be made conductive, whereas transistor T6, corresponding to transistor TII in FIG. 1, should remain nonconductive. In the power amplifier with the final stage transistors TIII and TIV, which is associated with the right end of winding W, transistor TIV is made conductive, whereas transistor TIII remains nonconductive.

To make transistor T5 of FIG. 3 conductive, a positive pulse, for example, a TTL level of 5 V is applied to input R of the power amplifier (curve A in FIG. 5). As a result, NPN transistor T1 becomes conductive, so that the base current of the final stage transistor T5 is capable of flowing from the positive terminal +V of the operating voltage source through the base emitter diode of T5, the resistor R3, the input transistor T1 and its emitter resistor R1 to the negative terminal of the operating voltage source. This enables transistor T5 to supply current to the motor winding W.

The switching time of transistor T5 is reduced as described below by the circuit combination comprising the resistor R2, the complementary transistors T3 and T4 and the capacitor C1. When transistor T1 is conductive, the part of the collector current flowing through resistor R2 causes a voltage drop of, for example, 6 V at this resistor (curve B in FIG. 5). As a result, the potential of the interconnected base electrodes of transistors T3 and T4 is lowered. As soon as the base potential is lowered by about 0.6 V over the emitter potential, PNP transistor T3 becomes conductive and NPN transistor T4 is nonconductive. Transistor T3 transfers the negative jump in potential at the collector of transistor T1 and thus at the base electrodes of transistors T3 and T4 to the emitters of T3 and T4. Transistor T3 remains conductive until its emitter and base potential are about the same. This change of the emitter potential is transferred through capacitor C1 to the base of output transistor T5. Consequently, the potential at the base of transistor T5 becomes more strongly negative for a short time (curve C) and transistor T5 is rapidly switched on by making the base current excessively high.

Transistor T5 is also rapidly switched off by the circuit combination comprising the resistor R2, the complementary transistors T3 and T4 and the capacitor C1. If the input transistor T1 is made nonconductive by terminating the pulse applied to its base, the emitter base current circuit of transistor T5 is interrupted, so that this transistor becomes nonconductive. This process is accelerated by the positive jump in potential at the collector of T1, which also raises the base potential of NPN transistor T4. As soon as this potential has been raised by about 0.6 V over the emitter potential, NPN transistor T4 again becomes conductive and PNP transistor T3 nonconductive. The conductive transistor T4 transfers the jump in potential at the collector of T1 and thus at the base electrodes of transistors T3 and T4 to the emitters of T3 and T4. Transistor T4 remains conductive until its emitter and base potential are about the same. Through capacitor C1, this positive jump in potential is transferred to the base of transistor T5. Transistor T5 is quickly made nonconductive by the positive charge carriers additionally applied to it through C1, which cause the base to be discharged more rapidly. After T5 has been switched off, node C readopts the potential $+V$ through resistor R4, i.e., capacitor C1 is discharged through transistor T4 and resistor R4.

The switching times of the complementary output transistor T6 are analogously reduced. As the input transistor T2, similar to the input transistor T1, is an NPN transistor controlled by TTL levels, control of the final stage transistor T6, which is complementary to T5, requires a transistor T7 acting as a phase reversal stage. When input transistor T2 is nonconductive, transistor T7 is conductive as a result of the base voltage occurring at the voltage divider formed by resistors R5, R8 and R9. If final stage transistor T6 is to be made conductive, a positive pulse is applied to the base of transistor T2, making this transistor conductive. Through resistor R6, the emitter current of transistor T2 is fed as a base current to the final stage transistor T6, so that this transistor starts conducting. The voltage drop occurring at collector resistor R5 when transistor T2 is conductive causes a lower base voltage to be applied to the voltage divider tap which is connected to the base of T7. As a result, transistor T7 becomes nonconductive, and its collector potential and thus the potential of the interconnected base electrodes of the two complementary transistors T8 and T9 will rise. NPN transistor T9 becomes conductive at a positive base potential, so that the potential of the two interconnected emitters of transistors T8 and T9 also rises (curve F). This change of the emitter potential of transistors T8 and T9 is fed through capacitor C2 as a positive needle pulse to the base of output transistor T6 which is made conductive faster by the charge carriers additionally applied to its base.

According to the invention, transistor T6 is also switched off faster. When input transistor T2 is made nonconductive, the base-emitter circuit of transistor T6 is interrupted. As a result, transistor T6 becomes nonconductive. When transistor T2 is made nonconductive, its collector potential and thus the potential at the base of transistor T7, which is connected to the tap of the voltage divider with resistors R5, R8 and R9, will rise. As a result, transistor T7 becomes conductive, and its collector potential, which is also the potential of the base electrodes of transistors T8 and T9, will drop. At a negative base potential, transistor T8 becomes conductive, so that its emitter potential and that of transistor T9 will drop. This change in potential is transferred as a negative pulse through capacitor C2 to the base of transistor T6 which becomes nonconductive faster by the negative charge carriers additionally applied to it. After T6 has become nonconductive, node G initially has a negative potential. The potential of node G is raised up through resistor R7 to ground potential, partially discharging capacitor C2.

As previously mentioned, it is essential that final stage transistors T5 and T6 of the power amplifier do not become simultaneously conductive, as this would cause a high short-circuit current flow through the final stage transistors T5 and T6 from the positive terminal $+V$ to the negative terminal of the operating voltage source, without the motor winding limiting this flow. This, in turn, would lead to unduly high power dissipation and a substantially reduced service life of the power amplifier. With complementary transistors, there exist the risk of both final stage transistors becoming simultaneously conductive during the normal operation of the power amplifier. This is due to the fact that switching on of the final stage transistor T6, which during the normal operation of the power amplifier connects the amplifier output to the terminal of the operating voltage source linked with the reference potential, causes a drop of its collector potential. This drop is transferred through the parasitic base collector capacity CCB of the nonconductive final stage transistor T5 to its base, making this transistor conductive unless appropriate counter-measures are taken.

In the case of the power amplifier according to the present invention, the capacitor C3, the zener diode D2 and the diodes D3 and D4 prevent the two final stage transistors T5 and T6 from becoming simultaneously conductive. Capacitor C3 is connected between the junction of the two emitters of transistors T8 and T9 with capacitor C2 and the junction of the two diodes D3 and D4. The following measures prevent transistors T5 and T6 from becoming simultaneously conductive: If, as a result of switching on of transistor T6, the potential at the emitters of transistors T8 and T9 rises (curve F), this change in potential is not only transferred as a postive needle pulse (curve G) through capacitor C2 to the base of T6 but also through capacitor C3 and diode D4 to the base of transistor T5 (curve H). Thus, the effect of the voltage drop at the collector of transistor T6, which is tranferred by the base collector capacity CCB to the base of transistor T5, is compensated for so the transistor T5 remains nonconductive when transistor T6 is switched on. To prevent the two final stage transistors T5 and T6 from being made simultaneously conductive by a posivite potential applied to the inputs R and U of the power amplifier as a result of a defect, input R is connected through resistor R15 to the base of an NPN transistor T11, whose collector is connected to the second input U of the power amplifier and whose emitter is grounded. Similarly, the base of a second NPN transistor T10 is connected to the second input U through resistor R14 and a diode D7. The collector of transistor T10 is linked with the first input R, its emitter is also grounded.

This overload protection circuit operates as follows: If as a result of a defect, with input transistor T1 being conductive, the second input U of the power amplifier is subjected to a positive potential, which in the absence of an overload protection circuit would make transistor T6 conductive, transistor T11 becomes conductive thereby discharging the base current of T2 to ground. As a result, transistor T2 and the corresponding final stage transistor T6 remain nonconductive. Conversely, if a defect causes a control signal to be applied to input R when input transistor T2 is already conductive transistor T10 discharges the base current of transistor T1 to ground.

Transistor T10, which discharges the base current of T1 to ground in the case of a defect, is also activated by the current limiting circuit 2 in those cases where upon starting of the brushless DC motor and at very low speeds the counterelectromotive force in the motor winding is insufficient, so that the final stage transistors of the two power amplifiers permitting the current flow through the motor winding would be overloaded. Transistor T10, which is made conductive by the current limiting circuit 2 through resistor R13 and diode D6, prevents this by discharging the base current of the first input transistor T1 to ground.

Figure 4:
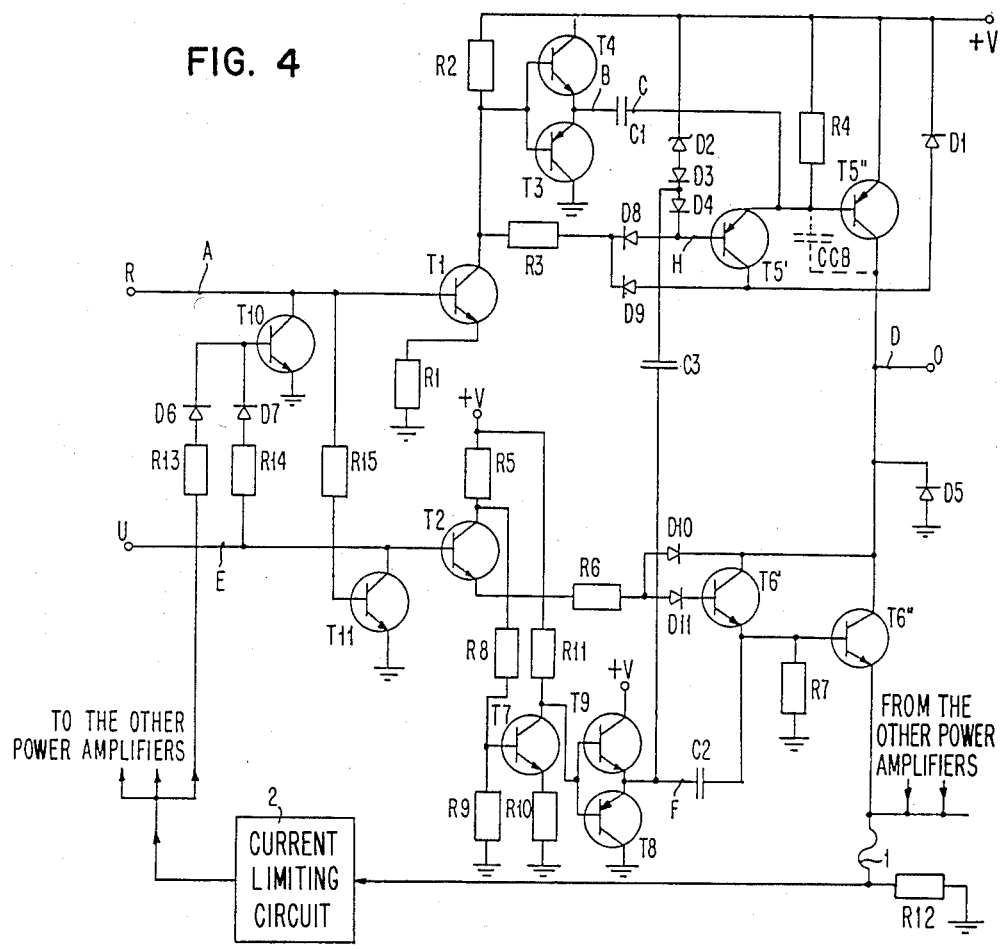
FIG. 4 shows a detailed circuit diagram of a second embodiment of a power amplifier according to the invention, in which the final stage transistors are designed as Darlington circuits.

FIG. 4 shows the circuit diagram of a second embodiment of a power amplifier in accordance with the present invention. It differs from the embodiment shown in FIG. 3 by each of the final stage transistors T5 and T6 of FIG. 3 being replaced by a Darlington circuit (FIG. 4) comprising two discrete transistors T5' and T5" and T6' and T6", respectively. The diodes D8 and D9 and D10 and D11, respectively, keep transistors T5' and T6' out of saturation, which would increase the switching times of the Darlington circuit. The two diodes D8 and D9 prevent the collector potential of transistor T5' from rising above the base potential. Thus, transistor T5' is operated just outside its range of saturation. Output transistor T5" is also kept out of saturation, as its collector potential is always maintained at a value less than its base potential by transistor T5' arranged between the base and collector of T5". The circuit diagram of FIG. 3 differs from that of FIG. 4 also by the cathode of diode D4 being connected to the base of transistor T5' of the upper Darlington circuit. However, the operation of the circuit of FIG. 4 is similar to that of the circuit shown in FIG. 3.

The circuit feature consisting of the capacitor C3 and the diodes D2, D3 and D4, which in the circuit diagram of FIG. 4 is provided only for the upper Darlington circuit comprising T5' and T5" may, if required (as in the case when the base-collector capacity CCB of transistor T6' and its power amplification are high), also be provided for the lower Darlington circuit comprising T6' and T6".

Charge carriers discharged from the capacitor C3 through transistor T8 are replaced via zener diode D2 and diode D3. Zener diode D2 limits the charge flow and permits C3 to be charged more rapidly than would be possible by a resistor. This measure supports shorter switching times and higher switching frequencies.

Diodes D1 and D5, which are connected in parallel to the final stage transistors T5 and T6 (FIG. 3) and T5" and T6" (FIG. 4), respectively, are clamping diodes. When final stage transistors T5 and T5", respectively, are pulse-operated, these clamping diodes prevent the occurrence of high induced voltages, as they permit the current passing the motor winding to retain its present direction when said transistors are made nonconductive.

While the invention has been particularly shown and described with reference to preferred embodiments thereof, it will be understood by those skilled in the art tht various changes in form and detail may be made therein without departing from the spirit and scope of the invention.

What is claimed is:

1. A transistor power amplifier having short switching times comprising:
   an input terminal;
   an output terminal;
   an input stage provided with an input bipolar transistor having the base thereof connected to said input terminal, collector thereof connected to a positive voltage source and emitter thereof connected to a negative voltage source maintained at a reference potential;
   an output stage provided with first and second output bipolar transistors interconnected in Darlington circuit configuration including the emitter of said first output transistor connected to said positive voltage source, the collector of said first output transistor connected to said output terminal, the base of said first output transistor connected to the emitter of said second output transistor, the base of said second output transistor connected, via a first diode, to the collector of said input transistor and the collector of said second output transistor connected, via a second diode, to said positive voltage source and, via a third diode, to the collector of said input transistor; and
   a pair of complementary bipolar transistors having their bases interconnected and their emitters interconnected, said interconnected bases being connected to the collector of said input transistor, said interconnected emitters being connected, via a capacitor, to the base of said first output transistor and the collectors of said complementary transistors being connected to said positive and negative voltage sources, respectively.

2. A transistor power amplifier having short switching times, comprising:
   first and second input terminals;
   an output terminal;
   a first input bipolar transistor, the base of which is connected to said first input terminal and the collector and emitter of which are connected, respectively, to a positive voltage source and negative. voltage source, said negative source serving also as a reference potential;
   a second input bipolar transistor, the base of which is connected to said second input terminal and the collector of which is connected to said positive voltage source;
   a first output bipolar transistor having its emitter connected to said positive voltage source and its collector connected to said output terminal;
   a second output bipolar transistor which is of a complementary-type to said first output transistor, said second output transistor having its emitter connected to said negative voltage source, its collector connected to said output terminal and its base connected to the emitter of said second input transistor and to said reference potential;

a first pair of first and second complementary bipolar transistors having their respective bases interconnected and emitters interconnected, said interconnected bases being connected directly to the collector of said first input transistor, said interconnected emitters being connected, via a first capacitor, to the base of said first output transistor and the collectors of said first and second complementary transistors of said first pair being connected to said positive and negative voltage sources, respectively; and a second pair of first and second complementary bipolar transistors having their respective bases interconnected and emitters interconnected, said interconnected bases of said second pair being connected to said positive voltage source, said interconnected emitters of said second pair being connected, via a second capacitor, to the base of said second output transistor and the collectors of said first and second complementary transistors of said second pair being connected to said positive and negative voltage sources, respectively.

3. The power amplifier as recited in claim 2 further comprising:

a first diode with the cathode thereof connected to the base of said first output transistor;

a zener diode having its cathode connected to said positive voltage source; and a second diode having its anode connected to the anode of said zener diode and cathode connected to the anode of said first diode; and a third capacitor connected between the anode of said first diode and the interconnected emitters of said second pair of complementary transistors whereby said first and second output transistors are prevented from simultaneously becoming conductive.

4. The power amplifier as recited in claim 3 further comprising:

a third output bipolar transistor having its emitter connected to the base of said first output transistor, its base connected to the cathode of said first diode and its collector connected, via a third diode, to the positive voltage source and, via a fourth diode, to the collector of said first input transistor; and a fourth output bipolar transistor having its emitter connected to the base of said second output transistor, collector connected to said output terminal and base connected, via a fifth diode, to the emitter of said second input transistor;

a sixth diode connected between the base of said second output transistor and the collector of said first input transistor; and a seventh diode connected between the emitter of said input transistor and the collector of said fourth output transistor.

5. The transistor power amplifier as recited in claim 2, 3 or 4 further comprising:

a first overload protection transistor of the same type as said first input transistor, said overload protection transistor having its collector connected to said first input terminal, its emitter connected to said negative voltage source and its base connected, via a first resistor, to the base of said second input transistor; and a second overload protection transistor of the same type as said second input transistor, said second overload protection transistor having its base connected, via a second resistor, to the base of said first input transistor, its collector connected to said second input terminal and its emitter connected to said negative voltage source.

* * * * *